(12) United States Patent
Zhong et al.

(10) Patent No.: US 9,691,753 B2
(45) Date of Patent: Jun. 27, 2017

(54) ZENER TRIGGERED SILICON CONTROLLED RECTIFIER WITH SMALL SILICON AREA

(71) Applicant: SEMICONDUCTOR MANUFACTURING INTERNATIONAL (SHANGHAI) CORPORATION, Shanghai (CN)

(72) Inventors: Lei Zhong, Shanghai (CN); Hongwei Li, Shanghai (CN); Wei Lei, Shanghai (CN); Huijuan Cheng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/093,725

(22) Filed: Apr. 7, 2016

(65) Prior Publication Data

US 2016/0343701 A1    Nov. 24, 2016

(30) Foreign Application Priority Data

May 19, 2015   (CN) .......................... 2015 1 0255838

(51) Int. Cl.
| | |
|---|---|
| *H01L 29/66* | (2006.01) |
| *H01L 27/02* | (2006.01) |
| *H01L 27/06* | (2006.01) |
| *H01L 29/87* | (2006.01) |
| *H01L 29/06* | (2006.01) |

(52) U.S. Cl.
CPC ...... *H01L 27/0262* (2013.01); *H01L 27/0647* (2013.01); *H01L 29/0649* (2013.01); *H01L 29/87* (2013.01)

(58) Field of Classification Search
CPC ............. H01L 27/0262; H01L 27/0647; H01L 29/0649; H01L 29/87
See application file for complete search history.

(56) References Cited

U.S. PATENT DOCUMENTS

| | | |
|---|---|---|
| 5,072,273 A | 12/1991 | Avery |
| 2011/0133247 A1 | 6/2011 | Sarbishaei et al. |

*Primary Examiner* — Robert Bachner
(74) *Attorney, Agent, or Firm* — Kilpatrick Townsend & Stockton LLP

(57) ABSTRACT

A semiconductor device includes a P-type semiconductor substrate, an N-well and a P-well disposed adjacent to each other and extending along a first direction within the P-type semiconductor substrate, a first N+ doped region and a first P+ doped region extending along the first direction within the N-well and spaced away from each other along a second direction perpendicular to the first direction, a second N+ doped region and a second P+ doped region extending along the first direction within the P-well and spaced away from each other along the second direction, and a plurality of third N+ doped regions and a plurality of P+ doped regions alternatively disposed in a junction region formed between the N-well and P-well the third N+ doped regions. The third N+ doped regions and the third P+ doped regions form a Zener diode.

10 Claims, 3 Drawing Sheets

ZENER TRIGGERED SILICON CONTROLLED RECTIFIER WITH SMALL SILICON AREA

CROSS-REFERENCES TO RELATED APPLICATIONS

This application claims priority to Chinese patent application No. 201510255838.X, filed May 19, 2015, the content of which is incorporated herein by reference in its entirety.

This application is related to co-pending application entitled "An Improved Low Voltage Triggered Silicon Controlled Rectifier with High Holding Voltage and Small Silicon Area," by Lei Zhong, Hongwei Li, Wei Li, Guang Chen, and Huijuan Cheng, filed Jun. 10, 2016, (U.S. application Ser. No. 15/179,321), now U.S. Pat. No. 9,613,946, the content of which is incorporated by reference in its entirety.

FIELD OF INVENTION

The present invention relates to semiconductor technology, and more particularly to a Zener triggered silicon controlled rectifier and an electronic apparatus containing the same.

BACKGROUND OF THE INVENTION

In the field of semiconductor technology, the electrostatic discharge (ESD) phenomenon poses a major threat to the reliability of an integrated circuit (IC) device. With the decrease in the feature size of semiconductor technology nodes, the design of ESD protection has become a more difficult and more challenging task in nanoscale CMOS technology.

Silicon-controlled rectifier (SCR) devices exhibit strong ESD robustness and strong current discharge capacity per unit area. SCR devices are widely used as on-chip structures for electrostatic discharge (ESD) protection. When integrated on-chip in a low-operating power source IC device, the high triggering voltage of an SCR device faces limitations in the range of applications. Therefore, some advanced techniques, such as Zener diode triggered SCR (alternatively referred to as Zener-triggered SCR) devices have been proposed to enhance the ESD efficiency. However, conventional Zener-triggered SCR devices consume a large silicon real estate. Conventional SCR devices also face the problems of lower current discharge capacity per unit area.

FIG. 1A is a cross-sectional view of a conventional Zener-triggered SCR device. FIG. 1B is a top plan view of the Zener-triggered SCR device of FIG. 1A. FIG. 1C is a schematic of a Zener-triggered SCR device that can be applied to the present invention. The Zener-triggered SCR device includes a SCR device and an auxiliary Zener diode integrated in the SCR device to speed up turn-on time of the SCR device. The Zener diode is disposed between a base of a PNP transistor and a base of an NPN transistor. The Zener diode is formed of an N+ implanted region and a P+ implanted region embedded within the SCR device. When an ESD event occurs at the anode of the SCR device, the Zener diode turns on first, causing a current flowing through the P-well of the SCR device, and ultimately turning on the SCR device through the voltage drop in the resistance of the P-well.

Comparing with conventional SCR devices, Zener-triggered SCR devices have an additional N+ implanted region in the junction region between the N-well and the P-well, and an additional P+ implanted region in the P-well. The P+ implanted region is adjacent to the N+ implanted region and forms together with the N+ implanted region an integrated Zener diode. The additional P+ implanted region and the additional N+ implanted region increase the silicon surface area, while reducing the current discharge capacity per unit area of the SCR device.

Thus, there is a need to provide a novel semiconductor device structure to reduce the surface area of the semiconductor substrate.

BRIEF SUMMARY OF THE INVENTION

Embodiments of the present invention provide an improved Zener-triggered silicon controlled rectifier having a small silicon area, and an apparatus including the same.

In accordance with embodiments of the present invention, a semiconductor device includes a P-type semiconductor substrate, an N-well and a P-well disposed adjacent to each other and extending along a first direction within the P-type semiconductor substrate, a first N+ doped region and a first P+ doped region extending along the first direction within the N-well and spaced away from each other along a second direction perpendicular to the first direction, a second N+ doped region and a second P+ doped region extending along the first direction within the P-well and spaced away from each other along the second direction, and a plurality of third N+ doped regions and a plurality of P+ doped regions alternatively disposed in a junction region formed between the N-well and P-well and extending along the first direction, the third N+ doped regions and the third P+ doped regions being separated from the adjacent first P+ doped region and second N+ doped region. The third N+ doped regions and the third P+ doped regions form a Zener diode.

In one embodiment, the first N+ doped region and the first P+ doped region are connected to each other to form an anode of a silicon controlled rectifier (SCR) device.

In one embodiment, the second N+ doped region and the second P+ doped region are connected to each other to form a cathode of a silicon controlled rectifier (SCR) device.

In one embodiment, the semiconductor device includes an NPN transistor and a PNP transistor, and the Zener diode is disposed between a base of the NPN transistor and a base of the PNP transistor.

In one embodiment, the semiconductor device further includes a first insulation structure disposed between the first N+ doped region and the first P+ doped region, and a second insulation structure disposed between the second N+ doped region and the second P+ doped region. The first and second insulator structures are shallow trench insulator structures.

Embodiments of the present invention also provide an electronic device that comprises a semiconductor device and an electronic component connected to the semiconductor device. The semiconductor device may be the above-described semiconductor device.

Embodiments of the present invention also provides a Zener-triggered silicon controlled rectifier (SCR) device including a first node and a second node. The first node may be connected to a power supply or an input/output of a device for ESD protection. The Zener-triggered SCR device includes a P-type semiconductor substrate, an N-well and a P-well disposed adjacent to each other and extending along a first direction within the P-type semiconductor substrate, a first N+ doped region and a first P+ doped region extending along the first direction within the N-well and separated from each other by a first shallow trench insulation structure, a second N+ doped region and a second P+ doped region extending along the first direction within the P-well and separated from each other by a second shallow trench insulation structure, a plurality of third N+ doped regions and a plurality of P+ doped regions alternatively disposed in a junction region formed between the N-well and the P-well to form a Zener diode. The Zener-triggered SCR device also includes a PNP transistor having a base and its emitter connected to the first node, and an NPN transistor having an emitter connected to the second node.

In one embodiment, the Zener-triggered SCR device may further include a first resistor connected between the base of the PNP transistor and the first node, and a second resistor connected between a base of the NPN transistor and the second node.

In one embodiment, the Zener diode is connected between the base of the PNP transistor and the base of the NPN transistor The following description, together with the accompanying drawings, will provide a better understanding of the nature and advantages of the claimed invention.

DETAILED DESCRIPTION OF THE INVENTION

Figure 1A:
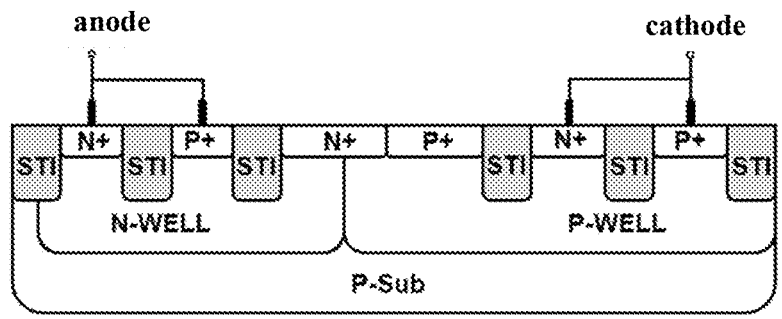
FIG. 1A is a cross-sectional view of a conventional Zener-diode assisted trigger SCR device, as known in the prior art.
Figure 1B:
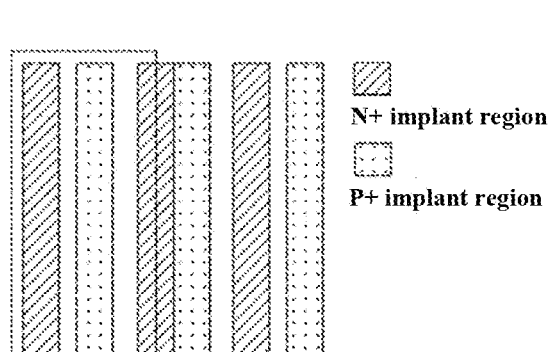
FIG. 1B is a top view of the conventional Zener-diode assisted trigger SCR device of FIG. 1A.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms"first" "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a," "an," and "the" may include singular and plural references. It will be further understood that the terms "comprising," "including," having " and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items. As used herein, the terms "example embodiment," "exemplary embodiment," and "present embodiment" do not necessarily refer to a single embodiment, although it may, and various example embodiments may be readily combined and interchanged, without departing from the scope or spirit of the present invention.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

First Embodiment

Figure 2A:
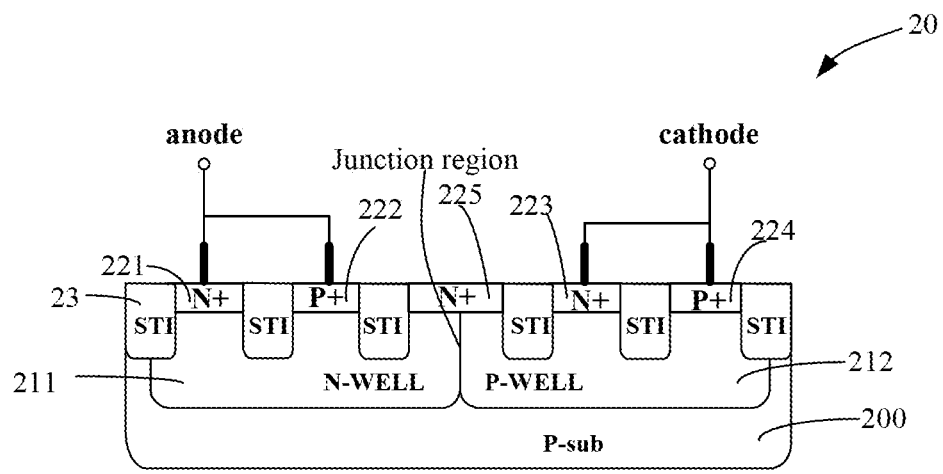
FIG. 2A is a cross-sectional view of a semiconductor device according to an embodiment of the present invention.
Figure 2B:
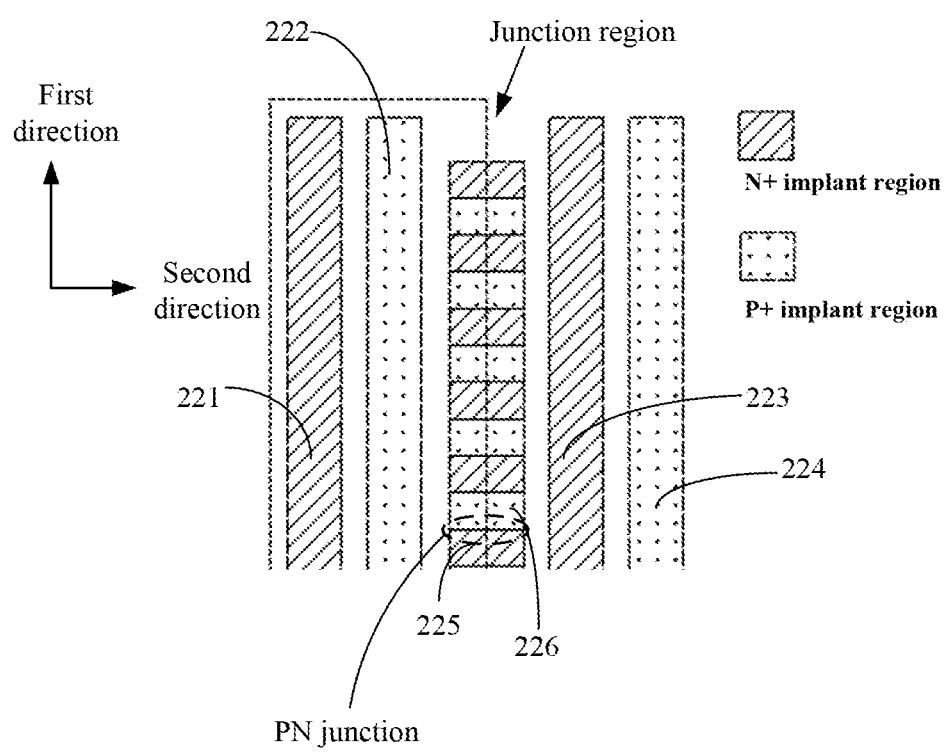
FIG. 2B is a top plane view illustrating the semiconductor device of FIG. 2A.

FIG. 2A is a cross-sectional view of a semiconductor device 20 according to an embodiment of the present invention. FIG. 2B is a top plane view of the semiconductor device of FIG. 2A. Referring to FIGS. 2A and 2B, a semiconductor device according to the present invention includes a semiconductor substrate 200. Semiconductor substrate 200 may be one of silicon, silicon on insulator (SOI), stacked silicon on insulator (SSOI), stacked SiGe on insulator (S—SiGeOI), SiGe on insulator (SiGeOI), Ge on insulator (GeOI), and the like. Semiconductor substrate 200 may be a P-type semiconductor substrate doped with a P-type dopant.

Semiconductor substrate 200 further includes a N-well 211 and a P-well 212 that are disposed adjacent to each other and extending along a first direction within the P-type semiconductor substrate 200. N-well 211 includes a first N+ implanted (doped) region 221 and a first P+ implanted region 222, both of which are extending along the first direction within N-well 211 and are spaced away (separated) from each other along a second direction perpendicular to the first direction. First N+ implanted region 221 and first P+ implanted region 222 are connected to each other to form an anode of an SCR device. As used herein, the term N+ implanted region refers to a region that is heavily doped with an N-type dopant having a dopant concentration of at least $1 \times 10^{19}$ atoms/cm$^3$. The term P+ implanted region refers to a region that is heavily doped with a P-type dopant having a dopant concentration of at least $1 \times 10^{19}$ atoms/cm$^3$. The term N+ and P+ implanted regions are alternatively referred to as N+ and P+ doped regions in this disclosure.

P-well 212 includes a second N+ implanted region 223 and a second P+ implanted region 224, both of which are extending along the first direction within P-well 212 and are spaced away (separated) from each other along the second direction. Second N+ implanted region 223 and second P+ implanted region 224 are connected to each other and form a cathode of the SCR device.

Semiconductor substrate 200 also includes a plurality of third N+ implanted regions 225 and a plurality of third P+ implanted regions 226. Third N+ implanted regions 225 and third P+ implanted regions 226 are arranged alternately along the first direction within a junction region formed between N-well 211 and P-well 212, and are spaced away (separated) from the adjacent first P+ implanted region 222 and second N+ implanted region 223 in the second direction. Each of the third N+ implanted regions 225 forms with one of adjacent third P+ implanted region 226 a PN junction, as shown in FIG. 2B. The alternate third N+ and P+ implanted regions 225, 226 form a Zener diode. Although FIG. 2A only shows a third N+ implanted region 225, it is shown in FIG. 2B that third P+ implanted regions 226 and third N+ implanted regions 225 are alternatively arranged in the first direction. Furthermore, in order to obtain a small surface area, the third N+ implanted regions and the third P+ implanted regions have a reduced width in the second direction. In some embodiments, the third N+ implanted regions and the third P+ implanted regions have the same width in the second direction.

In an exemplary embodiment, an insulation structure 23 is disposed between first N+ implanted region 221 and first P+ implanted region 222. An insulation structure 23 is also disposed between second N+ implanted region 223 and second P+ implanted region 224. In a preferred embodiment, insulation structure 23 is a shallow trench insulation (STI) structure.

An SCR devices can be formed of a parasitic bipolar NPN transistor and a parasitic bipolar PNP transistor. N-well 211 forms the base of the PNP transistor, first P+ implanted region 222 forms the emitter of the PNP transistor, and P-type semiconductor substrate 200 forms the collector of the PNP transistor. N-well 211 forms the collector of the NPN transistor, second N+ implanted region 223 within P-well 212 forms the emitter of the NPN transistor, and P-well 212 forms the base of the NPN transistor. The Zener diode formed of the plurality of alternate third N+ implanted regions 225 and P+ implanted regions 226 is disposed between the base of the PNP transistor and the base of the NPN transistor.

Figure 1C:
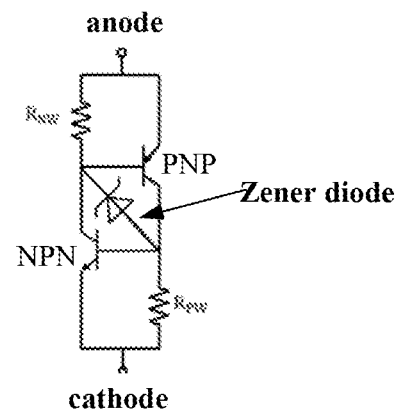
FIG. 1C is a schematic circuit diagram of a Zener-triggered SCR device that can be applied to the present invention.

The schematic circuit diagram of the semiconductor device 20 according to the present invention is shown as a Zener triggered SCR device of FIG. 1C. Referring to FIG. 1C, the emitter of the PNP transistor is connected to the anode, and the emitter of the NPN transistor is connected to the cathode. The base of the PNP transistor is connected to the collector of the NPN transistor. The base of the NPN transistor is connected to the collector of the PNP transistor. An additional feedback is added to the SCR device to increase the trigger speed of the SCR device. A Zener diode embedded in the SCR device forms the feedback. The Zener diode is located between the base of the PNP transistor and the base of the NPN transistor.

Figure 2C:
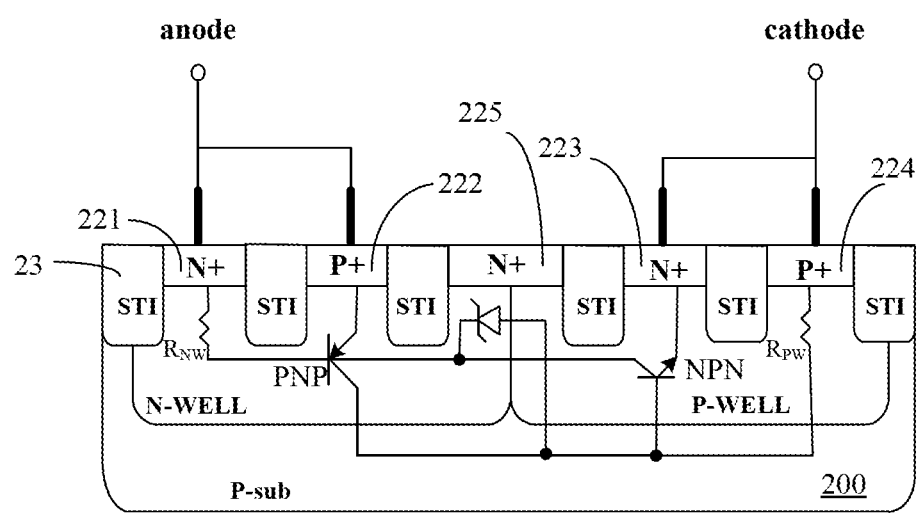
FIG. 2C is a schematic representation of a semiconductor device of FIGS. 2A and 2B.

FIG. 2C a schematic representation of the semiconductor device 20 of FIGS. 2A and 2B. As shown, the parasitic bipolar PNP and NPN transistors provide the SCR protection. The N-well resistor $R_{NW}$ is connected between the anode of the SCR to the base of the PNP transistor. The P-well resistor $R_{PW}$ is connected between the cathode of the SCR and the base of the NPN transistor.

Comparing with the conventional Zener-triggered SCR device (shown in FIG. 1A), a semiconductor device according to the present invention has an integrated Zener diode formed by a plurality of N+ and P+ implanted regions alternatively disposed in the junction region between (bridging) the N-well and P-well, thus does not require an additional P+ implanted region disposed external to the junction region, as required in the prior art. In accordance with the present invention, the alternate arrangement of the N+ implanted regions and the P+ implanted regions not only effectively reduces the silicon area, but also improves the turn-on speed of the SCR device. Furthermore, the semiconductor device of the embodiment of the present invention can be implemented using conventional semiconductor manufacturing processes, without additional process layers and masks. Thus, the manufacturing processes of the semiconductor device according to the present invention can be compatible with conventional semiconductor manufacturing processes (e.g., technology nodes 40 nm, 28 nm, and below) without requiring additional processes, thereby reducing manufacturing costs.

In summary, the semiconductor device according to the present invention has an integrated Zener diode formed by a plurality of N+ and P+ implanted regions alternatively disposed in the junction region between (bridging) the N-well and P-well, thus the semiconductor device does not require an additional P+ implanted region disposed outside the junction region. The novel Zener diode structure can effectively reduce the surface area of the semiconductor substrate and improve the turn-on speed of the SCR device.

Second Embodiment

Embodiments of the present invention also provide an electronic device including an electronic component and a semiconductor device connected to the electronic component. The semiconductor device can be the semiconductor device of embodiment 1.

Because the semiconductor device consumes a small surface area of the semiconductor substrate while providing a faster turn-on time of the SCR device, the electronic device incorporated such semiconductor device will have improved ESD protection.

In accordance with the present invention, the electronic device may be a mobile phone, a laptop computer, a netbook, a tablet PC, a game console, a TV, a DVD player, a GPS device, a camera, a voice recorder, MP3, MP4, PSP players, and other semiconductor devices including intermediate products and electronic components that incorporate the above-described semiconductor device with improved ESD protection.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
   a P-type semiconductor substrate;
   an N-well and a P-well disposed adjacent to each other and extending along a first direction within the P-type semiconductor substrate;
   a first N+ doped region and a first P+ doped region extending along the first direction within the N-well and spaced away from each other along a second direction perpendicular to the first direction;
   a second N+ doped region and a second P+ doped region extending along the first direction within the P-well and spaced away from each other along the second direction; and
   a plurality of third N+ doped regions and a plurality of P+ doped regions alternatively disposed in a junction region formed between the N-well and P-well and extending along the first direction, the third N+ doped regions and the third P+ doped regions being separated from the adjacent first P+ doped region and second N+ doped region,
   wherein the third N+ doped regions and the third P+ doped regions form a Zener diode.

2. The semiconductor device of claim 1, wherein the first N+ doped region and the first P+ doped region are connected to each other to form an anode of a silicon controlled rectifier (SCR) device.

3. The semiconductor device of claim 1, wherein the second N+ doped region and the second P+ doped region are connected to each other to form a cathode of a silicon controlled rectifier (SCR) device.

4. The semiconductor device of claim 1, wherein the semiconductor device comprises an NPN transistor and a PNP transistor, and the Zener diode being disposed between a base of the NPN transistor and a base of the PNP transistor.

5. The semiconductor device of claim 1, further comprising a first insulation structure disposed between the first N+ doped region and the first P+ doped region, and a second insulation structure disposed between the second N+ doped region and the second P+ doped region.

6. The semiconductor device of claim 5, wherein the first and second insulator structures are shallow trench insulator structures.

7. An electronic device comprising a semiconductor device and an electronic component connected to the semiconductor device, wherein the semiconductor device comprises:
   a P-type semiconductor substrate;
   an N-well and a P-well disposed adjacent to each other and extending along a first direction within the P-type semiconductor substrate;
   a first N+ doped region and a first P+ doped region extending along the first direction within the N-well and spaced away from each other along a second direction perpendicular to the first direction;
   a second N+ doped region and a second P+ doped region extending along the first direction within the P-well and spaced away from each other along the second direction; and
   a plurality of third N+ doped regions and a plurality of P+ doped regions alternatively disposed in a junction region formed between the N-well and P-well and extending along the first direction, the third N+ doped regions and the third P+ doped regions being separated from the adjacent first P+ doped region and second N+ doped region,
   wherein the third N+ doped regions and the third P+ doped regions form a Zener diode.

8. A Zener-triggered silicon controlled rectifier (SCR) device including a first node and a second node, the Zener-triggered SCR device comprising:
   a P-type semiconductor substrate;
   an N-well and a P-well disposed adjacent to each other and extending along a first direction within the P-type semiconductor substrate;

a first N+ doped region and a first P+ doped region extending along the first direction within the N-well and separated from each other by a first shallow trench insulation structure;
a second N+ doped region and a second P+ doped region extending along the first direction within the P-well and separated from each other by a second shallow trench insulation structure;
a plurality of third N+ doped regions and a plurality of P+ doped regions alternatively disposed in a junction region formed between the N-well and the P-well to form a Zener diode;
a PNP transistor having a base and its emitter connected to the first node; and
an NPN transistor having an emitter connected to the second node.

9. The Zener-triggered SCR device of claim 8, further comprising:
a first resistor connected between the base of the PNP transistor and the first node; and
a second resistor connected between a base of the NPN transistor and the second node.

10. The Zener-triggered SCR device of claim 9, wherein the Zener diode is connected between the base of the PNP transistor and the base of the NPN transistor.

* * * * *